United States Patent
Kye et al.

(10) Patent No.: US 8,839,168 B2
(45) Date of Patent: Sep. 16, 2014

(54) SELF-ALIGNED DOUBLE PATTERNING VIA ENCLOSURE DESIGN

(71) Applicant: GLOBALFOUNDRIES Inc., Grand Cayman (KY)

(72) Inventors: Jongwook Kye, Seou (KR); Harry J Levinson, Saratoga, NY (US); Jason E Stephens, Beacon, NY (US); Lei Yuan, Yancheng (CN)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/746,508

(22) Filed: Jan. 22, 2013

(65) Prior Publication Data

US 2014/0208285 A1    Jul. 24, 2014

(51) Int. Cl.
*G06F 17/50*    (2006.01)

(52) U.S. Cl.
CPC .................................. *G06F 17/5077* (2013.01)
USPC .......................................................... 716/110

(58) Field of Classification Search
USPC ................................................ 716/100, 110
See application file for complete search history.

(56) References Cited

U.S. PATENT DOCUMENTS

| | | | | |
|---|---|---|---|---|
| 7,605,037 | B2 * | 10/2009 | Weis | 438/270 |
| 8,211,807 | B2 * | 7/2012 | Chen et al. | 438/717 |
| 8,347,240 | B2 * | 1/2013 | Agarwal et al. | 716/54 |
| 8,381,139 | B2 * | 2/2013 | Lin et al. | 716/52 |
| 8,448,097 | B2 * | 5/2013 | Dai et al. | 716/52 |
| 8,677,297 | B2 * | 3/2014 | Chase et al. | 716/112 |
| 2008/0192526 | A1 * | 8/2008 | Weis | 365/63 |
| 2010/0205575 | A1 * | 8/2010 | Arora et al. | 716/11 |
| 2012/0091592 | A1 * | 4/2012 | Chen et al. | 257/773 |
| 2012/0110521 | A1 * | 5/2012 | Agarwal et al. | 716/52 |
| 2012/0135600 | A1 * | 5/2012 | Lin et al. | 438/667 |
| 2012/0144349 | A1 * | 6/2012 | Dai et al. | 716/52 |
| 2013/0074024 | A1 * | 3/2013 | Chase et al. | 716/112 |
| 2013/0130410 | A1 * | 5/2013 | Lin et al. | 438/14 |

* cited by examiner

*Primary Examiner* — Suchin Parihar (74) *Attorney, Agent, or Firm* — Darrell L. Pogue; Keohane & D'Alessandro, PLLC (57) ABSTRACT

A design methodology for determining a via enclosure rule for use with a self-aligned double pattern (SADP) technique is disclosed. The shape of the block mask serves as a criterion for choosing a via enclosure rule. Different block mask shapes within an integrated circuit design may utilize different rules and provide different margins for via enclosure. A tight via enclosure design rule reduces the margin of a line beyond the via where possible, while a loose via enclosure design rule increases the margin of a line beyond the via where it is beneficial to do so.

20 Claims, 6 Drawing Sheets

SELF-ALIGNED DOUBLE PATTERNING VIA ENCLOSURE DESIGN

FIELD OF THE INVENTION

The present invention relates generally to semiconductor fabrication and, more particularly, to via enclosure design with self-aligned double-patterning technology.

BACKGROUND

Due to an increased demand for highly integrated semiconductor memory devices, techniques of integrating more devices onto a small area have become strongly relied upon. The integration of many devices onto a small area involves downscaling the devices to be formed on a semiconductor substrate. However, the downscaling of the devices has a limit. The wavelength of a light source used in a photolithography process, which determines the dimensions of a device, is reaching technical limitations.

To overcome this drawback, a method of forming a self-aligned double pattern (SADP) technique has been developed. The technique may utilize the resolution capabilities of a photolithography apparatus to form a pattern with double the pitch of a conventional pattern. In the SADP process, a core (also called mandrel) pattern is formed on a substrate by a lithography and an etch process. Material is deposited on each side of the mandrel, and the mandrel is then removed, resulting in a pattern that is double the pitch of the mandrel pattern. The sidewall deposition material, also referred to as a spacer, generates metal isolation areas for metal layers. A block layer then follows to define additional metal isolation areas, which is also referred to as a block mask or trim mask. While SADP provides advantages over other known techniques such as Lithography-Etch-Lithography-Etch (LELE) processing, various design challenges still remain when using SADP for semiconductor fabrication.

SUMMARY

In general, embodiments of the invention provide a design methodology that uses the shape of the block mask as a design criterion for determining a via enclosure rule. Different block mask shapes within an integrated circuit design may utilize different rules and provide different margins for via enclosure. A tight via enclosure design rule reduces the margin of a line beyond the via where possible, while a loose via enclosure design rule increases the margin of a line beyond the via where it is beneficial to do so. In this way, the design layout and placement of lines and vias can be better optimized to improve circuit density and performance.

A first aspect of the present invention includes a method for computing via enclosure rules, comprising: identifying line termination modes in a self-aligned double patterning line pattern comprising a plurality of lines and vias; assigning a first via enclosure rule in response to identifying a line termination mode of inner vertex block mask; and assigning a second via enclosure rule in response to identifying a line termination mode of outer vertex block mask.

A second aspect of the present invention includes a method for computing via enclosure rules, comprising: identifying line termination modes in a self-aligned double patterning line pattern comprising a plurality of lines and vias; assigning a first via enclosure rule in response to identifying a set of aligned adjacent lines; and assigning a second via enclosure rule in response to identifying a set of misaligned adjacent lines.

A third aspect of the present invention includes a non-transitory computer-readable medium comprising instructions which, when executed by a processor, perform the steps of: identifying line termination modes in a self-aligned double patterning line pattern comprising a plurality of lines and vias; assigning a first via enclosure rule in response to identifying a line termination mode of inner vertex block mask; and assigning a second via enclosure rule in response to identifying a line termination mode of outer vertex block mask.

BRIEF DESCRIPTION OF THE DRAWINGS

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity. Furthermore, for clarity, some reference numbers may be omitted in certain drawings.

Features of this invention will be more readily understood from the following detailed description of the various aspects of the invention taken in conjunction with the accompanying drawings in which.

DETAILED DESCRIPTION

Exemplary embodiments will now be described more fully herein with reference to the accompanying drawings, in which exemplary embodiments are shown. Exemplary embodiments of the invention provide a design methodology that uses the shape of the block mask as a design criterion for determining a via enclosure rule. Different block mask shapes within an integrated circuit design may utilize different rules and provide different margins for via enclosure. A tight via enclosure design rule reduces the margin of a line beyond the via where possible, while a loose via enclosure design rule increases the margin of a line beyond the via where it is beneficial to do so. In this way, the design layout and placement of lines and vias can be better optimized to improve circuit density and performance.

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer), is present on a second element, such as a second structure (e.g. a second layer), wherein intervening elements, such as an interface structure (e.g. interface layer), may be present between the first element and the second element.

Figure 1:
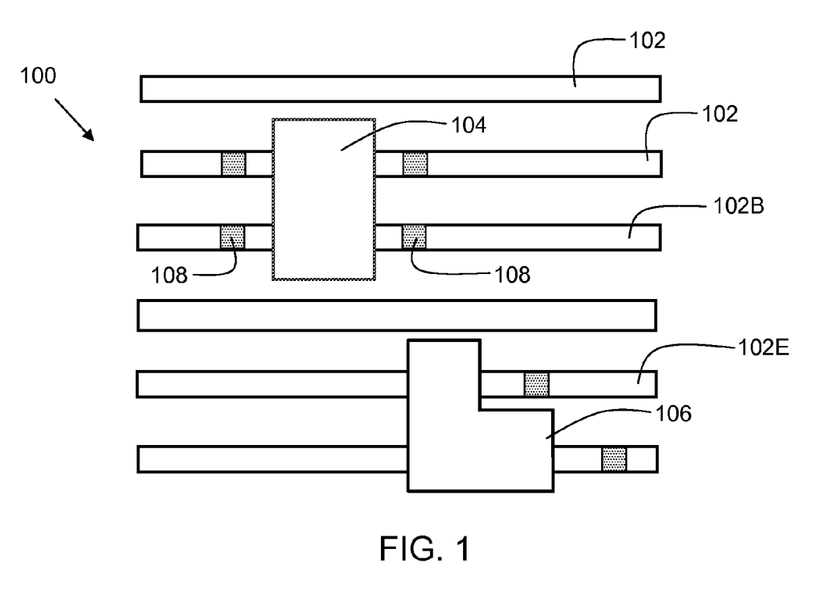
FIG. 1 shows an example of an SADP structure with block masks in place, in accordance with illustrative embodiments.

FIG. 1 shows an example of an SADP structure 100 with block masks 104 and 106 in place. Structure 100 comprises multiple metal lines, indicated generally as 102. Vias, indicated generally as 108, are conductive regions which connect a metallization layer with another metallization layer above or below it. To form various electronic circuits, some of the lines 102 are separated in various places by block masks, such as 104 and 106.

Figure 2:
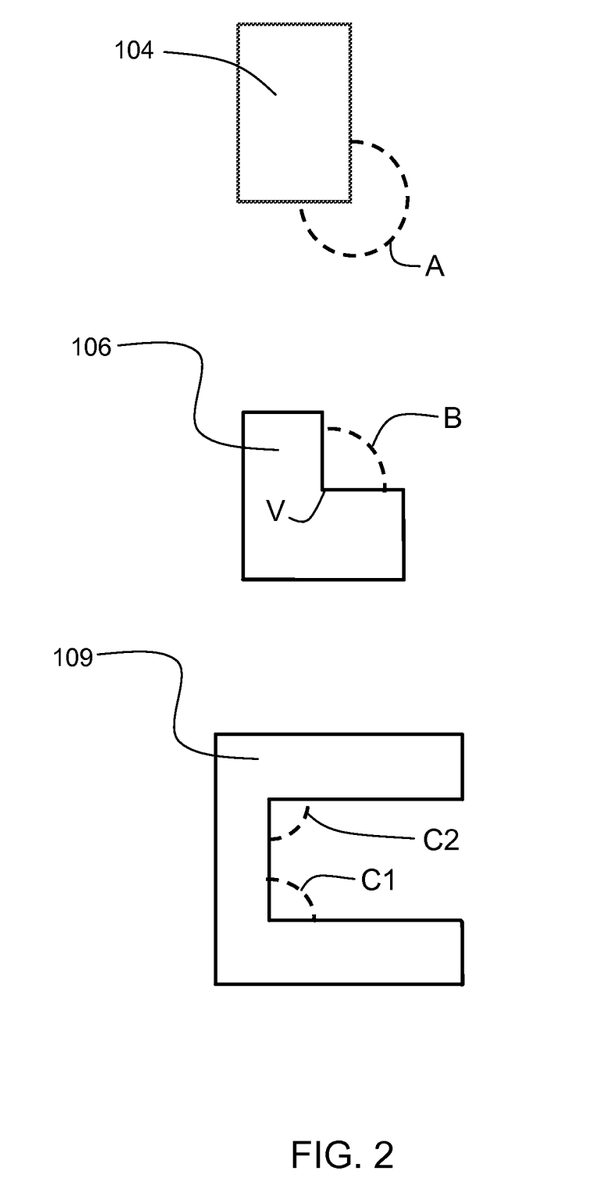
FIG. 2 shows details of an outer vertex block mask and an inner vertex block mask, in accordance with illustrative embodiments.

FIG. 2 shows details of an outer vertex block mask 104 and inner vertex block masks 106 and 109. An outer vertex block mask, such as 104, is defined such that every vertex, as measured from the outside of the block mask, has an angle A that is greater than 180 degrees. A rectangular block mask is an example of an outer vertex block mask. An inner vertex block mask, such as 106, is defined such that at least one vertex, as measured from the outside of the block mask, has an angle B that is less than 180 degrees. For block mask 106, vertex V is an inner vertex. Block mask 106 is an L-shaped block mask, and is an example of an inner vertex block mask. Block mask 109 is a U-shaped block mask, and is another example of an inner vertex block mask, as vertices C1 and C2 are less than 180 degrees.

Referring back to FIG. 1, line 102B terminates at block mask 104, which is an outer vertex block mask. Hence, line 102B has a line termination mode of outer vertex block mask. Line 102E terminates at block mask 106, which has at least one inner vertex block mask. Hence, line 102E has a line termination mode of inner vertex block mask. In some cases, a line may terminate on a mandrel or other structure, instead of terminating at a block mask. Other termination modes, such as a line termination mode of mandrel, may be used in some embodiments to incorporate additional design rules for lines terminating at other structures. In some embodiments, the design rule for a line terminating at a mandrel may be the same as the loose via enclosure design rule used for a line termination mode of inner vertex block mask. The design rules for a given via are assigned based on the line termination mode that is identified for that via.

Figure 3:
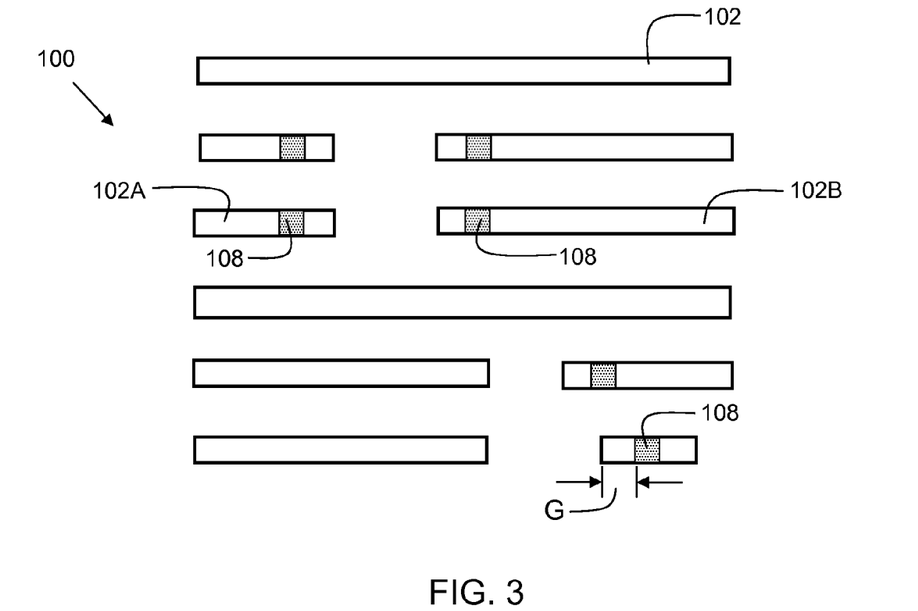
FIG. 3 shows an example of cut lines of a metallization layer, in accordance with illustrative embodiments.

FIG. 3 shows an example of an SADP structure 100 with the block masks removed, revealing the cut lines of a metallization layer. Line segment 102A is separate from line segment 102B, since a block mask (see 104 of FIG. 1) was used during formation of structure 100. The block masks are removed from the final semiconductor product prior to completion of fabrication. Ideally, a via 108 may be placed on the endpoint of a line, which would minimize the amount of space required for a circuit, serving to increase circuit density. However, in practice, due to the effects of lithography, lines do not terminate so cleanly. Therefore, an additional margin G is added to each line, beyond the point of the via. The margin G is used to account for the phenomenon of line edge shortening, where the length of the actual metal line that is fabricated is shorter than the designed length. By using a margin G, there is a high probability that the via is properly positioned on, and making good contact with, the line, which improves product reliability and yield.

Figure 4:
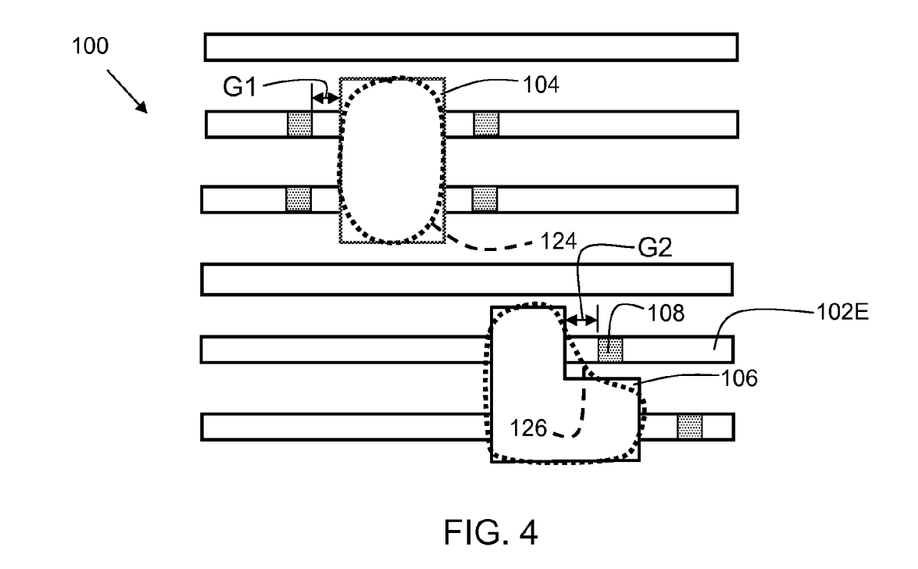
FIG. 4 shows an example of actual block mask shapes, in accordance with illustrative embodiments.

FIG. 4 shows SADP structure 100 indicating actual block mask shapes in accordance with embodiments of the present invention. Block mask 104 is an outer vertex block mask. The rectangle indicated by reference 104 is its ideal shape. Its actual shape is indicated by contour 124. The actual shape differs from the ideal shape due to lithographic effects, in which sharp corners tend to be fabricated somewhat rounded. Block mask 106 is an inner vertex block mask. The L-shape indicated by reference 106 is its ideal shape. Its actual shape is indicated by contour 126. The rounding of corners at the inner vertex V (see FIG. 2) causes line shortening on segment 102E to the left of the via 108. However, with an outer vertex block mask, the rounding does not induce the adverse effect of line shortening, so margin G1 can be made smaller than margin G2. By using a design process that takes the block mask type into account, a more efficient layout is possible. A tight via enclosure design rule is used for vias on lines terminated by an outer vertex block mask, and a loose via enclosure design rule is used for vias on lines terminated by an inner vertex block mask. The tight via enclosure design rule corresponds to margin G1. The loose via enclosure design rule corresponds to margin G2. Margin G2 is larger than margin G1. In some embodiments, margin G2 is two to three times larger than margin G1. In some embodiments, margin G2 ranges from about 28 nanometers to about 32 nanometers and margin G1 ranges from about 8 nanometers to about 12 nanometers. The distances used for the margins depend on the critical dimension of the technology being used.

Figure 5:
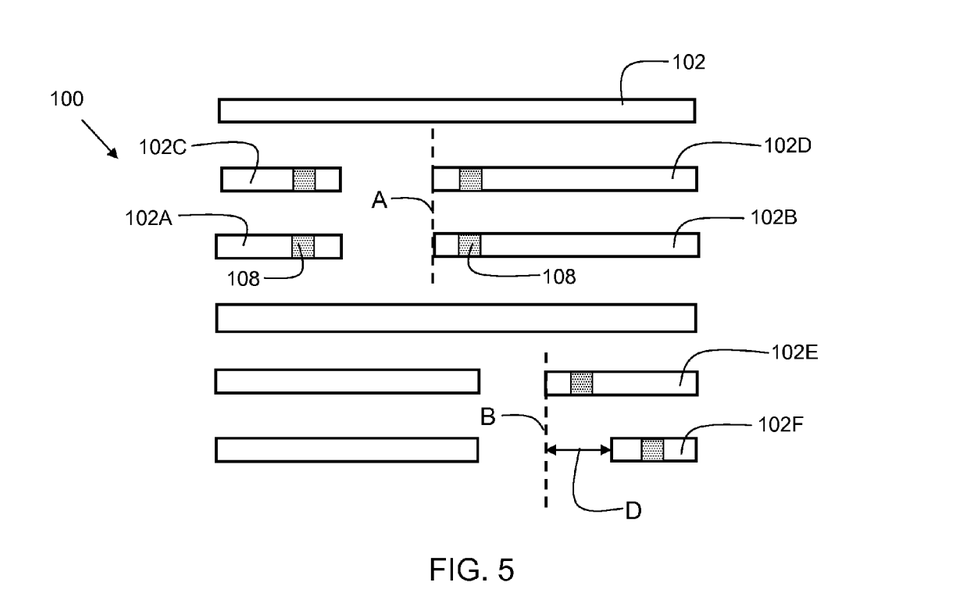
FIG. 5 shows misalignment identification in accordance with alternative illustrative embodiments.

FIG. 5 shows misalignment identification in accordance with an alternative embodiment of the present invention. In this embodiment, instead of identifying block mask types (outer vertex or inner vertex), the alignment of adjacent line terminations is compared to determine which design rule (loose or tight) to apply. In FIG. 5, line segments 102D and 102B have aligned endpoints along line A, which is perpendicular to the elongated sides of lines 102B and 102D. Hence, lines 102B and 102D make up a set of aligned adjacent lines. Lines 102A and 102C make up another set of aligned adjacent lines. In contrast, adjacent lines 102E and 102F have misaligned endpoints along line B, as line 102E touches line B, and line 102F terminates at a distance D from line B, where D>0. Hence, lines 102E and 102F make up a set of misaligned adjacent lines. In this embodiment, misaligned adjacent lines (adjacent lines with misaligned endpoints such as 102E and 102F) use a loose via enclosure design rule, and aligned adjacent lines (adjacent lines with aligned endpoints such as 102B and 102D) use a tight via enclosure design rule. The end result is similar to that described for FIG. 4, but in this embodiment, the actual block mask does not need to be considered.

Figure 6:
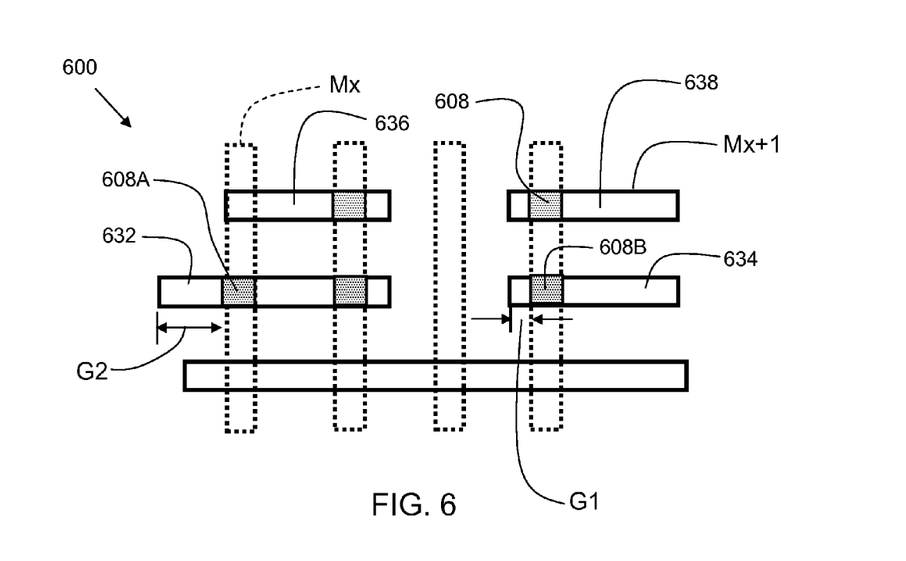
FIG. 6 shows a circuit in accordance with illustrative embodiments.

FIG. 6 shows a circuit 600 in accordance with an embodiment of the present invention. Circuit 600 includes two metallization layers. Layer Mx is vertically oriented, and layer Mx+1 is horizontally oriented. Multiple vias, indicated generally as 608, connect the two layers at various points within the circuit 600. Vias that are located near aligned endpoints, such as via 608B in the case of line 634 (which is aligned with line 638), use a tight via enclosure design rule, and use a margin G1. Vias that are located near misaligned endpoints, such as in the case of via 608A on line 632, which is misaligned with line 636, use a loose via enclosure design rule, and use a margin G2, where G2>G1. Hence, increased performance and circuit density can be achieved by using the tight design rule where possible, by giving consideration to the shape of the block mask.

Figure 7:
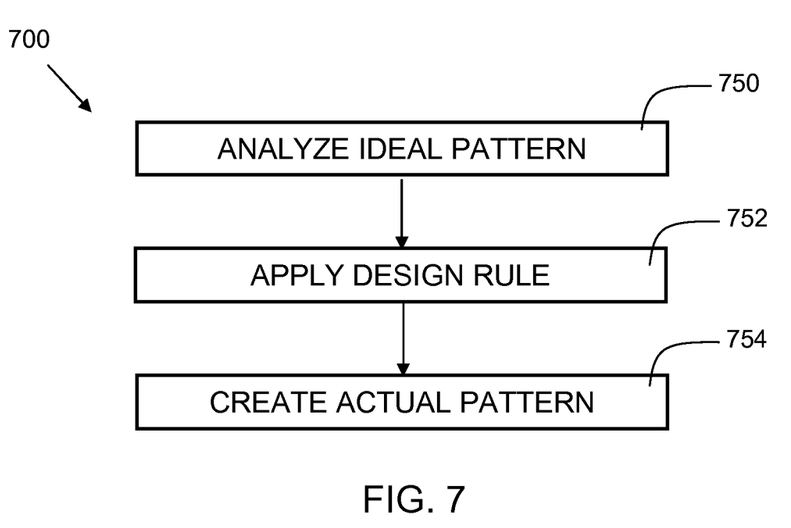
FIG. 7 is a flowchart indicating process steps for illustrative embodiments.

FIG. 7 is a flowchart 700 indicating process steps for an embodiment of the present invention. In process step 750, an ideal pattern is analyzed. The analysis may include block mask type identification, such as identifying outer vertex block masks and inner vertex block masks. Alternatively, or in addition, the analysis may include identifying adjacent sets of lines with aligned and misaligned endpoints. In process step 752 a design rule is applied. For embodiments that perform block mask type identification, an outer vertex block mask results in the use of a tight via enclosure design rule, and a smaller margin. An inner vertex block mask results in the use of a loose via enclosure design rule and a larger margin. For embodiments that perform line endpoint alignment identification, aligned endpoints in adjacent lines result in the use of a tight via enclosure design rule, and a smaller margin. Misaligned endpoints in adjacent lines results in the use of a loose via enclosure design rule and a larger margin. In process step 754, an actual pattern is created. This includes assigning the desired margin to each line based on the design rule used for each via. Hence, the vias for which a loose via enclosure design rule is assigned use a larger margin, and the vias for which a tight via enclosure design rule is assigned use a smaller margin.

Figure 8:
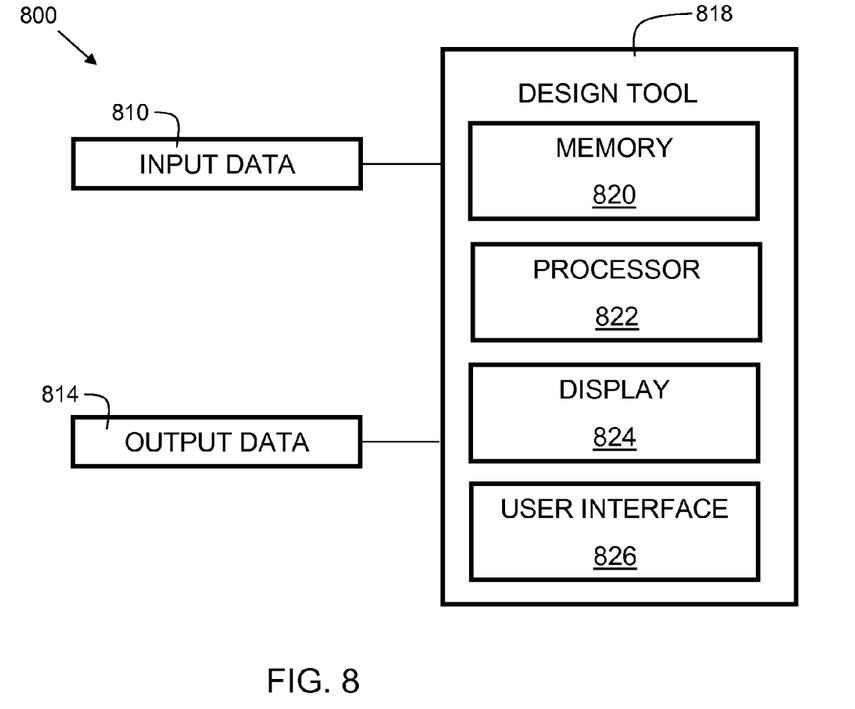
FIG. 8 is a design system in accordance with illustrative embodiments.

FIG. 8 is a design system 800 in accordance with an embodiment of the present invention. System 800 includes a design tool 818. Design tool 818 may be a computer comprising memory 820 and a processor 822, which is configured to read and write memory 820. The memory 820 may be a non-transitory computer-readable medium, such as flash, ROM, non-volatile static ram, or the like. The memory 820 contains instructions that, when executed by processor 822, control the various subsystems to operate system 800. Design tool 818 may also include a display 824 and a user interface 826 for interacting with the system 800. The user interface 826 may include a keyboard, touch screen, mouse, or the like.

The design tool 818 may receive input data 810. Input data 810 may include a design structure. The design structure may be a logical simulation design structure generated and processed by a design process to produce a logically equivalent functional representation of a hardware device. The design structure may also, or alternatively, include data and/or program instructions that when processed by design tool 818, generate a functional representation of the physical structure of a hardware device. The input data 810 may include hardware-description language (HDL) design entities or other data structures conforming to and/or compatible with lower-level HDL design languages such as Verilog and VHDL, and/or higher level design languages such as C or C++.

The design tool 818 may generate output data 814. The output data may reside in a storage medium in a data format used for the exchange of layout data of integrated circuits (e.g. information stored in a GDSII (GDS2), GL1, OASIS, or any other suitable format for storing such design structures). Output data 814 may include information such as, for example, test data files, design content files, manufacturing data, layout parameters, wires, levels of metal, vias, shapes, data for routing through the manufacturing line, and any other data required by a semiconductor manufacturer to produce embodiments of the present invention.

In various embodiments, design tools can be provided and configured to create the datasets used to pattern the semiconductor layers as described herein. For example, data sets can be created to generate photomasks used during lithography operations to pattern the layers for structures as described herein. Such design tools can include a collection of one or more modules and can also include hardware, software, or a combination thereof. Thus, for example, a tool can be a collection of one or more software modules, hardware modules, software/hardware modules, or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, application-specific integrated circuits (ASIC), programmable logic arrays (PLA)s, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for computing via enclosure rules, comprising:
  identifying, by at least one computing device, line termination modes in a self-aligned double patterning line pattern comprising a plurality of lines and vias;
  assigning, by the at least one computing device, a first via enclosure rule in response to identifying a line termination mode of inner vertex block mask, wherein the inner vertex block mask comprises at least one vertex that has an outer angle that is less than 180 degrees; and
  assigning, by the at least one computing device, a second via enclosure rule in response to identifying a line termination mode of outer vertex block mask, wherein the outer vertex block mask consists of vertices that have an outer angle that is greater than 180 degrees.

2. The method of claim 1, wherein assigning a first via enclosure rule comprises assigning a first margin, and wherein assigning a second via enclosure rule comprises assigning a second margin.

3. The method of claim 2, wherein the first margin is larger than the second margin.

4. The method of claim 3, wherein the first margin is about two to three times larger than the second margin.

5. The method of claim 3, wherein the first margin ranges from about 8 nanometers to about 12 nanometers, and wherein the second margin ranges from about 28 nanometers to about 32 nanometers.

6. The method of claim 2, further comprising assigning a third via enclosure rule in response to identifying a line termination mode of mandrel.

7. The method of claim 6, wherein assigning a third via enclosure rule comprises assigning a third margin.

8. The method of claim 7, wherein the third margin is equal to the first margin.

9. The method of claim 1, wherein identifying a line termination mode of outer vertex block mask comprises identifying a rectangular block mask.

10. The method of claim 1, wherein identifying a line termination mode of inner vertex block mask comprises identifying an L-shaped block mask.

11. The method of claim 1, wherein identifying a line termination mode of inner vertex block mask comprises identifying a U-shaped block mask.

12. A method for computing via enclosure rules, comprising:
  identifying, by at least one computing device, line termination modes in a self-aligned double patterning line pattern comprising a plurality of lines and vias;
  assigning, by the at least one computing device, a first via enclosure rule in response to identifying a set of aligned adjacent lines; and
  assigning, by the at least one computing device, a second via enclosure rule in response to identifying a set of misaligned adjacent lines.

13. The method of claim 12, wherein assigning a first via enclosure rule comprises assigning a first margin, and wherein assigning a second via enclosure rule comprises assigning a second margin.

14. The method of claim 13, wherein the second margin is larger than the first margin.

15. The method of claim 14, wherein the second margin is about two to three times larger than the first margin.

16. A non-transitory computer-readable medium comprising instructions which, when executed by a processor, perform the steps of:
  identifying line termination modes in a self-aligned double patterning line pattern comprising a plurality of lines and vias;
  assigning a first via enclosure rule in response to identifying a line termination mode of inner vertex block mask, wherein the inner vertex block mask comprises at least one vertex that has an outer angle that is less than 180 degrees; and
  assigning a second via enclosure rule in response to identifying a line termination mode of outer vertex block mask, wherein the outer vertex block mask consists of vertices that have an outer angle that is greater than 180 degrees.

17. The computer-readable medium of claim 16, further comprising instructions which, when executed by a processor, perform the steps of:
  assigning a first margin corresponding to the first via enclosure rule; and
  assigning a second margin corresponding to the second via enclosure rule.

18. The computer-readable medium of claim 16, further comprising instructions which, when executed by a processor, perform the step of assigning a third via enclosure rule in response to identifying a line termination mode of mandrel.

19. The computer-readable medium of claim 17, further comprising instructions which, when executed by a processor, perform the step of assigning the first margin as larger than the second margin.

20. The computer-readable medium of claim 19, further comprising instructions which, when executed by a processor, perform the step of assigning the first margin as about two to three larger than the second margin.

* * * * *

UNITED STATES PATENT AND TRADEMARK OFFICE
CERTIFICATE OF CORRECTION

PATENT NO.        : 8,839,168 B2                                Page 1 of 1
APPLICATION NO.   : 13/746508
DATED             : September 16, 2014
INVENTOR(S)       : Kye et al.

It is certified that error appears in the above-identified patent and that said Letters Patent is hereby corrected as shown below:

Title Page: Item (72)

Line 1: Delete "Seou" and insert -- Seoul --;

Line 2: Delete "NY" and insert -- CA --.

Signed and Sealed this
Twenty-eighth Day of April, 2015

Michelle K. Lee
*Director of the United States Patent and Trademark Office*